(12) United States Patent
Rollin et al.

(10) Patent No.: US 6,255,830 B1
(45) Date of Patent: Jul. 3, 2001

(54) METHOD OF TESTING SHIELDING EFFECTIVENESS AND ELECTROMAGNETIC FIELD GENERATOR FOR USE IN TESTING SHIELDING EFFECTIVENESS

(75) Inventors: Jacques J. Rollin, Magny-les-Hameaux (FR); Gianluca Arcari, Kanata; Gary Wong, Nepean, both of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/071,000

(22) Filed: May 4, 1998

(51) Int. Cl.⁷ .......................... G01R 37/28; G01R 23/20; G01R 1/24; H05K 9/00
(52) U.S. Cl. .......................... 324/627; 324/623; 324/639; 174/35 R; 343/703
(58) Field of Search .................... 324/627, 631, 324/647, 639, 623; 373/343, 703; 174/35 R, 35 MS

(56) References Cited

U.S. PATENT DOCUMENTS

| | | | |
|---|---|---|---|
| H821 | * 9/1990 | Hatfield et al. | 324/627 |
| 4,737,797 | * 4/1988 | Siwiak et al. | 342/859 |
| 5,001,494 | * 3/1991 | Dorman et al. | 343/703 |
| 5,068,616 | * 11/1991 | Broyde et al. | 324/627 |
| 5,075,580 | * 12/1991 | Dayton et al. | 326/77 |
| 5,124,662 | * 6/1992 | Downing et al. | 324/636 |
| 5,153,524 | * 10/1992 | McCormack | 324/627 |
| 5,401,901 | * 3/1995 | Gerry et al. | 174/35 MS |
| 5,499,200 | * 3/1996 | Podgorski | 395/500.23 |
| 5,904,980 | * 5/1999 | Rivas | 428/362 |
| 5,939,982 | * 8/1999 | Gagnon et al. | 340/539 |

FOREIGN PATENT DOCUMENTS

SU * 12/1987 (SU) .............................. G01R/29/00

OTHER PUBLICATIONS

The use of steel sheet for the construction of shielded rooms. A.M. Intrator, AIEE Transactions, vol. 72 Part I, Nov. 1953, pp. 599–605.*

ASTM D4935–99: Standard Method for Measuring the Electromagnetic Shielding Effectiveness of Planar Materials.*

J.P. Muccioli et al, Integrated Circuit Radiated Emissions Diagnostic Procedure 1MHz to 1000MHz, Magnetic Field–Loop Probe, Jan. 31, 1995, pp. 1–23, Electromagnetic Compatibility Measurement Procedures for Integrated Circuits.

J.P. Muccioli et al, Integrated Circuit Radiated Emission Measurement Procedure 150 kHz ro 1000 MHz, TEM Cell, Jan. 31, 1997, pp. 1–13, Electromagnetic Compatibility Measurement Procedures for Integrated Circuits.

* cited by examiner

Primary Examiner—Vinh P. Nguyen
Assistant Examiner—Anjan K Deb

(57) ABSTRACT

An electromagnetic field generator is provided which consists of a regulated self contained voltage supply connected to a high frequency clock which drives one or more printed circuit board antennas. The clock may be a TTL or ECL based clock for example. The electromagnetic field generator is used in a method of testing the shielding effectiveness of an enclosure. Two measurements are made with a measurement antenna of emissions from the electromagnetic field generator, one with the enclosure in place and another without the enclosure in place, the shielding effectiveness being the difference between these two measurements.

8 Claims, 10 Drawing Sheets

METHOD OF TESTING SHIELDING EFFECTIVENESS AND ELECTROMAGNETIC FIELD GENERATOR FOR USE IN TESTING SHIELDING EFFECTIVENESS

CROSS REFERENCE TO RELATED APPLICATION

This application is related to and claims benefit of a provisional application filed on May 19, 1998 bearing Ser. No. 60/046,958 with the same title and in the name of the same inventors.

This invention relates to methods of measuring the effectiveness of electromagnetic shielding and to electromagnetic field generators for use in testing shielding effectiveness.

Generally, all circuits emit electromagnetic energy generated by components such as clocks and integrated circuits. Although careful design methodologies are used to keep such radiation to a minimum, there will always be leakage due to uncontrollable parameters. Once all known techniques have been used to reduce noise at the PCB (printed circuit board) level, any remaining leakage may be eliminated by physically shielding the circuitry.

In most designs, metal enclosures are used to form a Faraday cage around the noisy electronics. A perfect shield is not possible, and therefore all metal enclosures have a certain amount of shielding which they are able to provide. The SE (shielding effectiveness) of an enclosure is defined as the amount of shielding (in dB) that the enclosure provides. The SE is the difference between the maximum emission levels of an electromagnetic field generator in free space and the maximum emission levels of the same electromagnetic field generator located within the enclosure.

Typically, the shielding effectiveness of an enclosure for electronic circuitry is measured by passing a cable to an antenna within the enclosure and feeding noise signals through the cable to the antenna from an external signal generator.

One problem is that the cable itself can contribute to the electromagnetic radiation and give rise to erroneous results.

SUMMARY OF THE INVENTION

It is an object of the invention to overcome problems associated with the use of cables and external signal generators.

According to a broad aspect, the invention provides a method of testing the effectiveness of electromagnetic shielding provided by an enclosure comprising: with a self-contained source of electromagnetic radiation placed entirely within said enclosure, the source comprising a clock pulse generator, a source antenna and a battery, making a first measurement of the radiation received by a measurement antenna located outside the enclosure; making a second measurement of the radiation received by the measurement antenna when the enclosure is removed; and comparing the first and second measurements.

According to a second broad aspect, the invention provides a method of testing the effectiveness of electromagnetic shielding provided by an enclosure comprising: with a self-contained source of electromagnetic radiation placed entirely within said enclosure, the source generating a signal having frequency content at a fundamental frequency and a plurality of harmonic frequencies, making a first series of measurements of radiation received from said source, one for each of the fundamental frequency and a finite number of the harmonic frequencies; making a corresponding second series of measurements of radiation received from said source when the enclosure is removed, one for each of the fundamental frequency and said finite number of harmonic frequencies; and comparing the first series of measurements with the second series of measurements.

According to a third broad aspect, the invention provides an apparatus comprising: a battery connected to a voltage regulator for producing a regulated voltage supply; a high frequency clock powered by said regulated voltage supply for producing a clock output signal; and at least one source antenna having an input connected to receive said clock output signal for generating an electromagnetic field.

According to a fourth broad aspect, the invention provides an apparatus for determining a shielding effectiveness provided by an enclosure comprising: a self-contained battery powered source of electromagnetic radiation comprising a clock pulse generator, a source antenna and a battery; a spectrum analyzer; a measurement antenna connected to the spectrum analyzer; wherein a first measurement is made of radiation received by the measurement antenna of radiation emanating from the source when located within the enclosure, a second measurement is made of radiation received by the measurement antenna of radiation emanating from the source when the enclosure is removed, and a comparison between the first and second measurements is made to determine the shielding effectiveness of the enclosure.

BRIEF DESCRIPTION OF THE DRAWINGS

Embodiments of the invention will now be described by way of example, with reference to the accompanying drawings, in which.

DETAILED DESCRIPTION OF THE PREFERRED EMBODIMENTS

Figure 1A:
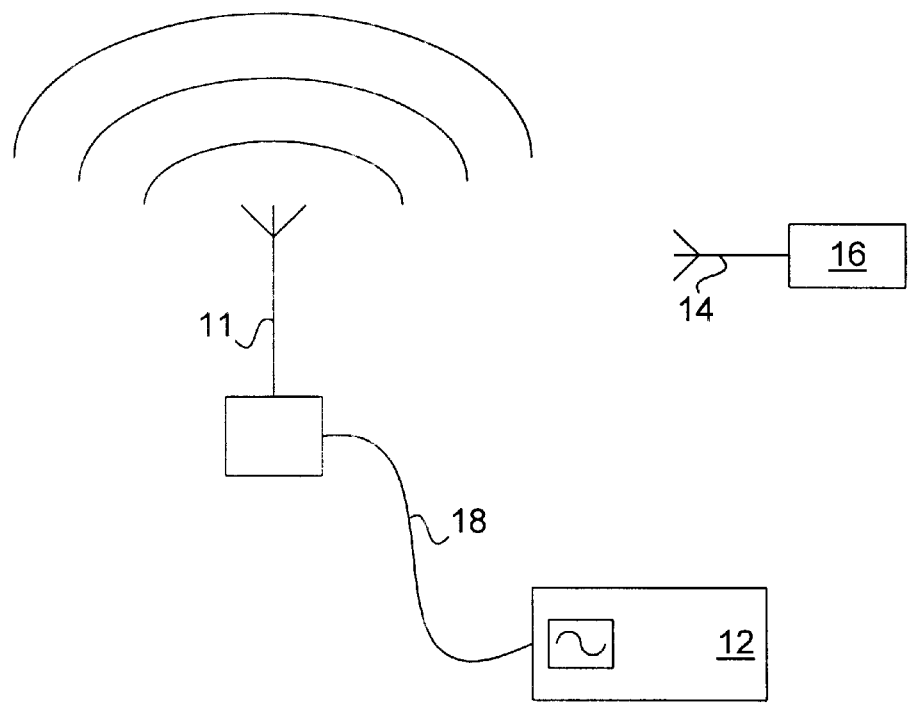
FIGS. 1A and 1B are schematic diagrams of a conventional shielding effectiveness testing apparatus.
Figure 1B:
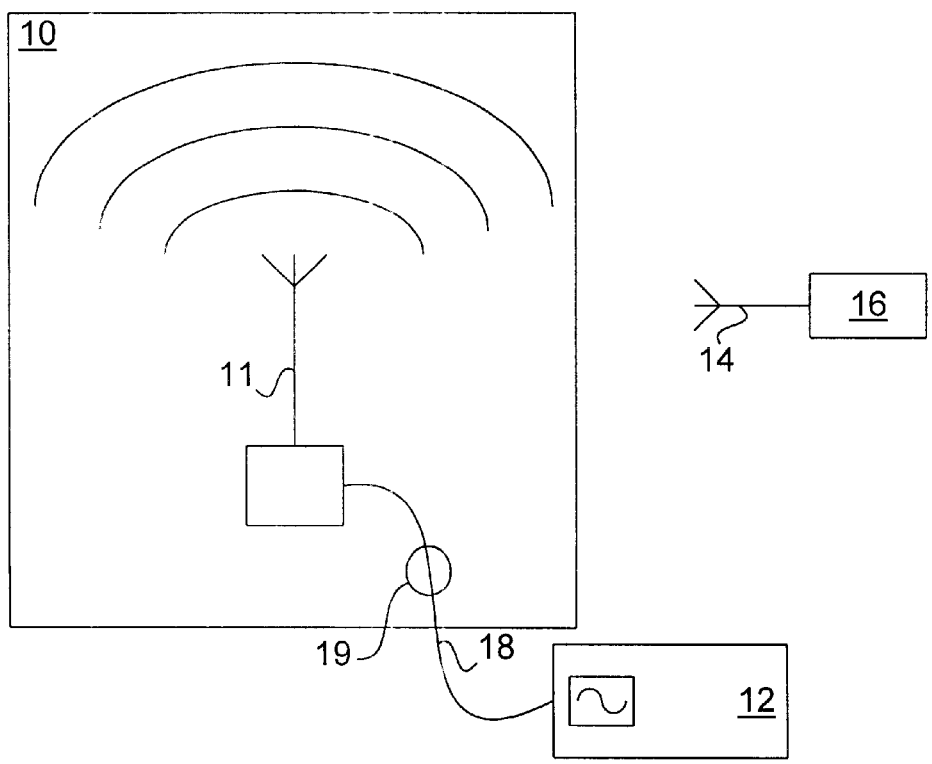

Referring firstly to FIGS. 1A and 1B, a conventional arrangement for measuring the SE of an enclosure 10 comprises a source antenna 11, a signal generator 12 connected to the source antenna 11 through a cable 18, and a measurement antenna 14 connected to an RF power meter 16. The signal generator 12 is used to generate a frequency sweep signal which is passed through cable 18 and then transmitted by source antenna 11. Measurement antenna 14 receives the resulting signal transmitted by the source antenna 11 and passes this to the RF power meter 16 which measures the received signal strength at the particular frequency being generated by the signal generator 12. In FIG. 1A, free space measurements are made of the emissions from the source antenna 11 in the absence of any shielding. In FIG. 1B, the enclosure 10 is installed, and measurements are made of the emissions from the source antenna 11 which are measurable at points external to the enclosure. The enclosure 10 must be modified to include an opening 19 through which to receive cable 18. The SE at a given frequency is the difference between the maximum free space measurement and the maximum enclosure measurement.

Figure 2A:
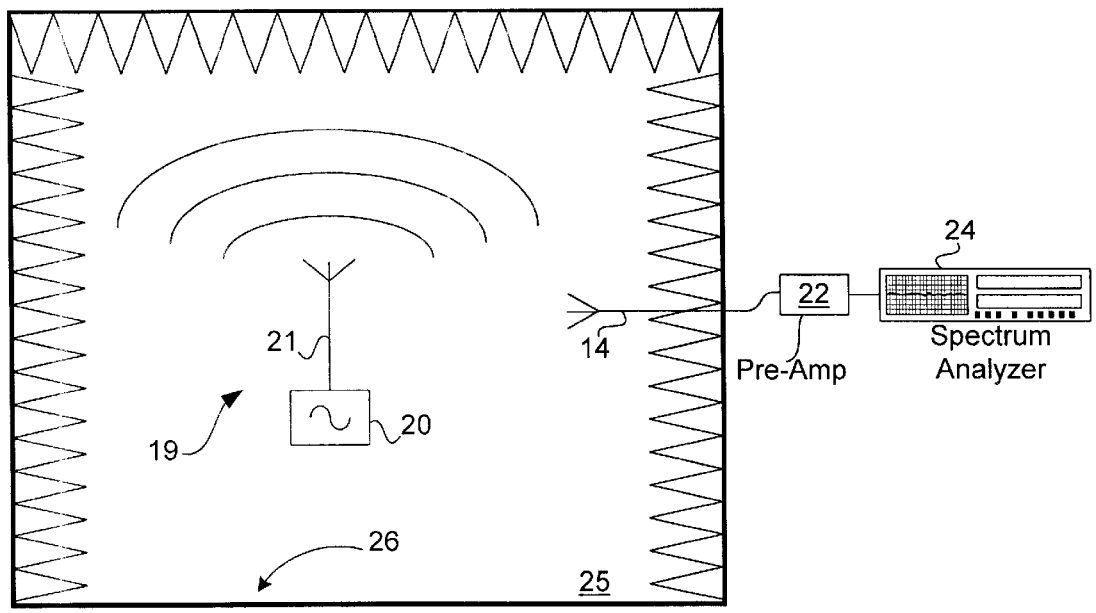
FIGS. 2A and 2B are schematic diagrams of a shielding effectiveness testing apparatus according to an embodiment of the invention.
Figure 2B:
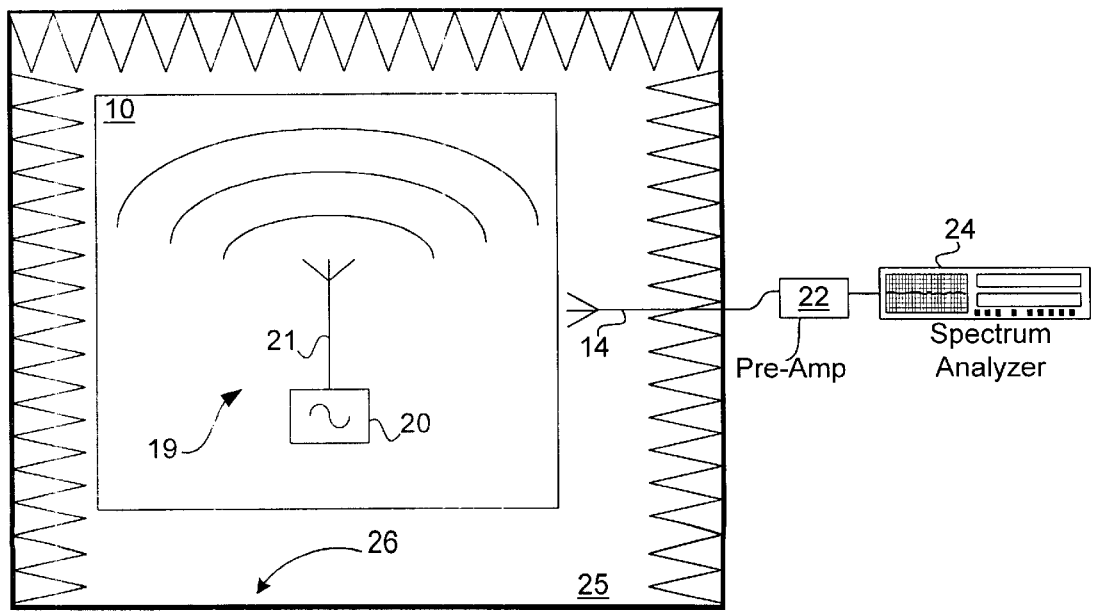

Referring now to FIGS. 2A and 2B, an arrangement according to an embodiment of the invention for measuring SE includes a self-contained electromagnetic field generator 19 having a signal generator 20 and a source antenna 21, a measurement antenna 14 connected through a low noise preamplifier 22 to a spectrum analyzer 24. The signal generator 20 is designed to generate through the source antenna 21 an electromagnetic field having frequency content at a plurality of frequencies spanning a frequency range of interest. Preferably the entire testing apparatus with the exception of the spectrum analyzer 24 and low noise preamplifier 22 are placed within an anechoic or semi-anechoic chamber 25 having a ground plane 26. For the purposes of example, the measurement antenna 14 and the electromagnetic field generator/shielded electromagnetic field generator 19 may be located one meter above the ground plane, with the measurement antenna 14 located three meters from the electromagnetic field generator/shielded electromagnetic field generator 19. Care must be taken to ensure that the measurement antenna 14 is pointed directly at the electromagnetic field generator/shielded electromagnetic field generator 19. The above exemplary dimensions may be changed to suit particular needs.

In FIG. 2A, free space measurements are made of the emissions from the source antenna 21 in the absence of any shielding. The spectrum analyzer 24 is used to determine the signal strength at each of said plurality of frequencies. In FIG. 2B, the enclosure 10 is installed, and measurements are made of the emissions from the source antenna 21 which are measurable at points external to the enclosure. Once again, the spectrum analyzer 24 is used to determine the signal strength at each of said plurality of frequencies. The SE at a given frequency is the difference between the maximum free space measurement and the maximum enclosure measurement.

The spectrum analyzer 24 is the tool used to measure the emission levels of the electromagnetic field generator 19. Any spectrum analyzer will do as long as its calibration range is as large as the frequency range of interest.

The low noise pre-amplifier 22 may be necessary in order to achieve measurable harmonics at high frequencies. For example, a pre-amplifier may be used which has a gain of 25 dB from 100 MHz to 16 GHz.

The measurement antenna 14 used depends mainly on the frequency range of interest. Generally, for frequencies under 2 GHz a bilog may be used, and for frequencies over 2 GHz a horn antenna may be used. Due to the fact that shielding effectiveness is based on a difference, it generally does not matter which antenna is used so long as the same one is used when comparing two points at a given frequency.

Figure 3A:
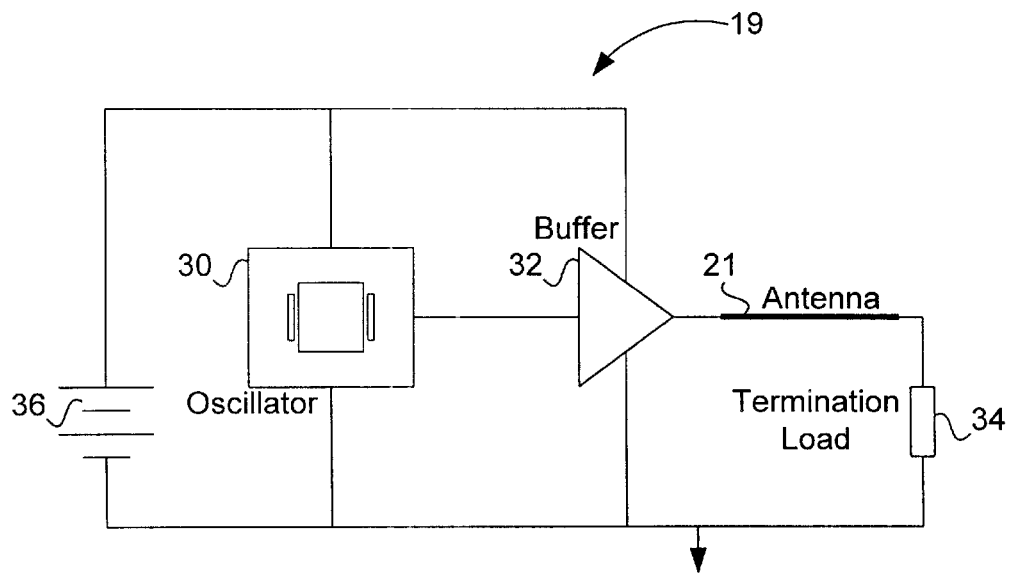
FIG. 3A is a simplified schematic diagram of an electromagnetic field generator for use in the apparatus of FIGS. 2A and 2B.

Referring now to FIG. 3A, the electromagnetic field generator 19 of FIGS. 2A and 2B comprises an oscillator 30, a buffer or amplifier 32, the source antenna 21 and a termination load 34 connected across a regulated voltage source 36.

Figure 3B:
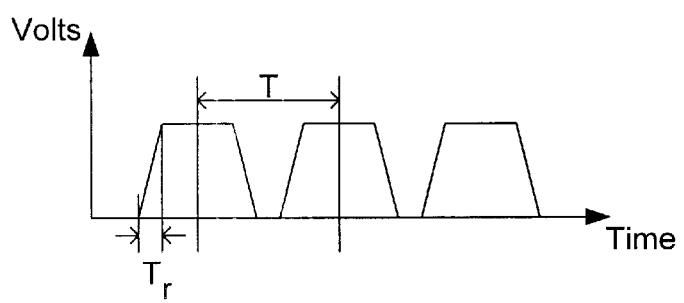
FIG. 3B is a time domain representation of the electromagnetic field generator of FIG. 3A.
Figure 3C:
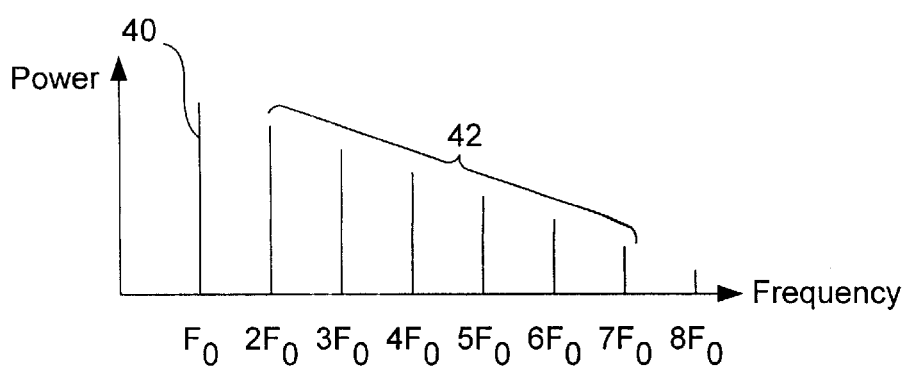
FIG. 3C is a diagram of the emissions spectrum produced by the electromagnetic field generator of FIG. 3A.

An exemplary time domain representation of a signal generated by the electromagnetic field generator 19 is shown in FIG. 3B. The signal consists of a periodic trapezoidal waveform having period T, and a fundamental frequency $F_0=1/T$ and a rise time $T_r$. An exemplary frequency domain representation of the time domain signal of FIG. 3B is shown in FIG. 3C and consists of an emission 40 at the fundamental frequency $F_0$, and then a series of evenly spaced harmonics 42 each having a frequency which is an integral multiple of $F_0$. The power in each of the harmonics 42 generally decreases with increasing frequency but this may not necessarily always be the case. The electromagnetic field generator 19 is useful over a range of frequency in which harmonics of a sufficient power exist. The lower the fundamental frequency $F_0$ of the oscillator 30, the greater the number of discrete harmonics which are generated in a given frequency range since the spacing between harmonics is equal to the fundamental frequency. The fundamental frequency of the electromagnetic field generator must not be too large in order to obtain enough resolution in the SE results.

The frequency spectrum of the trapezoidal waveform is a function of the waveform's rise time ($T_r$) and its period T. The spectrum envelope becomes wider (i.e. higher frequency content) with faster rise time and smaller period. Therefore, a fast oscillator 30 with minimal rise time will have a large number of harmonics.

Figure 4:
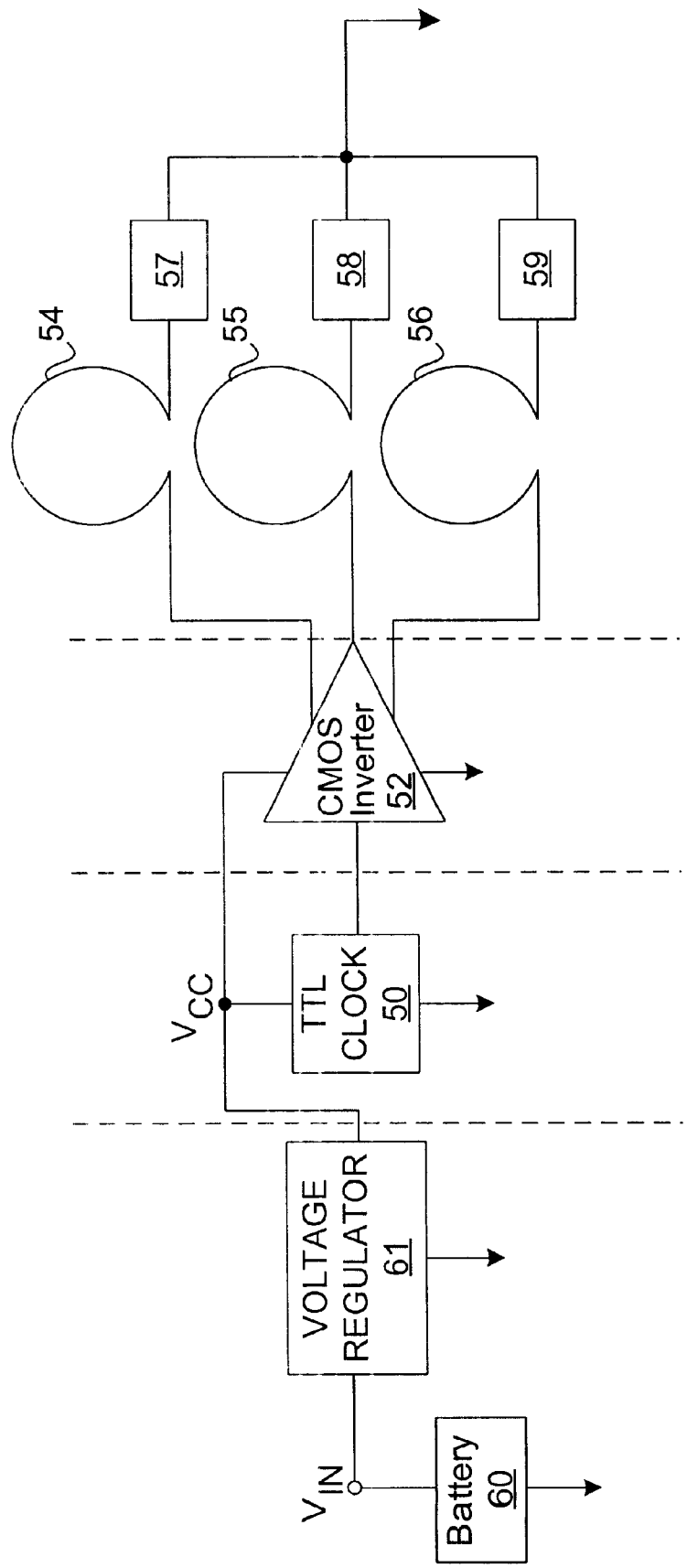
FIG. 4 is a schematic diagram illustrating the electromagnetic field generator of FIG. 3A in more detail, according to an embodiment of the invention employing a TTL-based clock.

A more detailed schematic of a preferred configuration of the FIG. 3A embodiment is shown in FIG. 4 in which case the oscillator 30 is a TTL clock 50, the buffer 32 is a CMOS inverter 52 and the source antenna 21 consists of three loop antennas 54,55,56 which are connected across respective termination loads 57,58,59. The advanced CMOS inverter 52 acts as a fanout buffer in order to create many clocks from only one. All of the clocks created by the inverter have the same signal strength and edge rates as the original signal from the TTL clock 50. With these extra clocks, more antennae may be driven at once for greater radiated emissions. The regulated voltage source 36 of FIG. 3A is shown to comprise a battery 60 connected through a voltage regulator 61, producing a positive regulated voltage $V_{cc}$.

The advantages of the TTL clock based electromagnetic field generator are:
a) its low cost, since TTL clocks are easy to find. It can be used with crystals having frequencies in the range of 10 MHz to 110 MHz; and
b) its low power consumption (it draws approximately 120 mA).

The disadvantages are:
a) its emission levels are only adequate for SE testing up to about 2 GHz; and
b) as the battery dies, emission levels drop slowly (the battery must be checked regularly to be sure of proper emissions).

Figure 5:
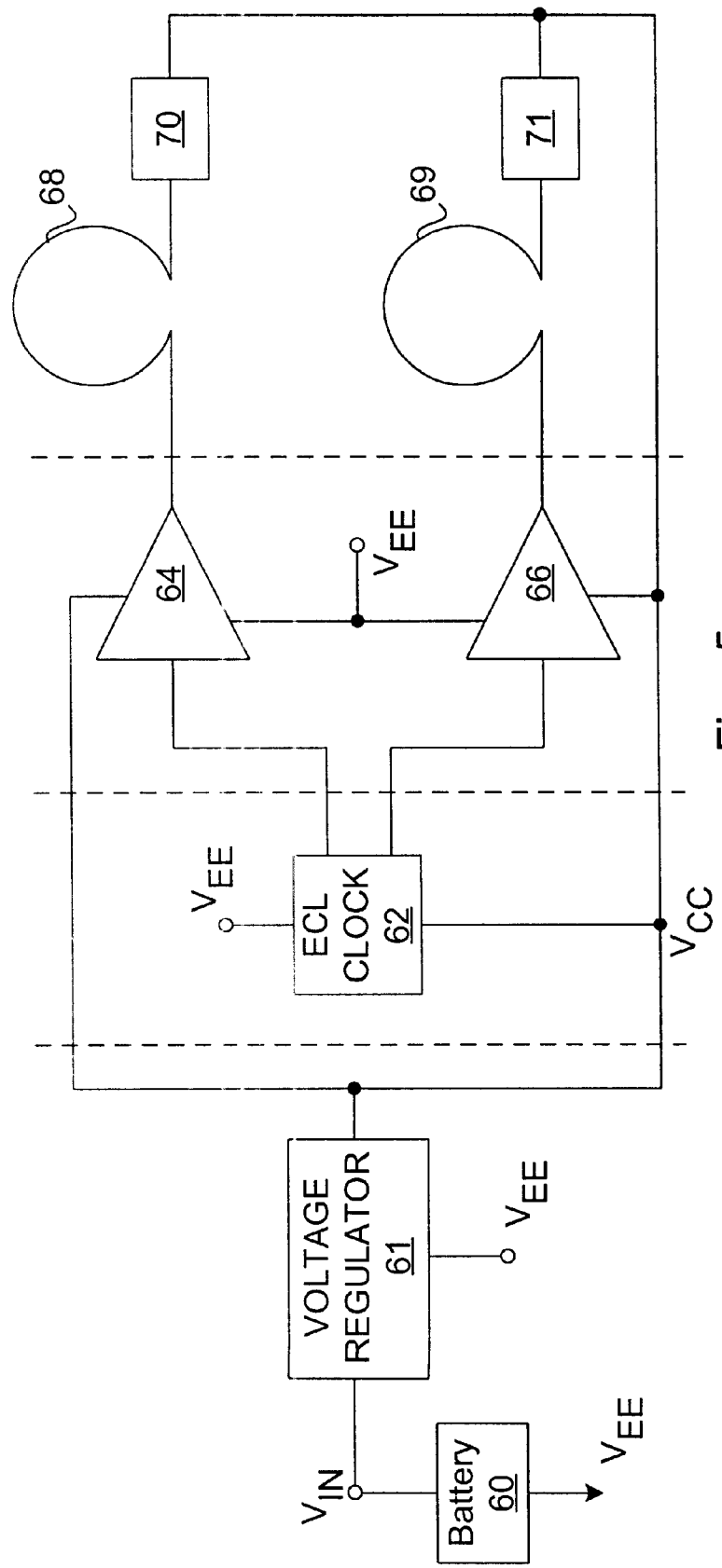
FIG. 5 is a schematic diagram illustrating the electromagnetic field generator of FIG. 3A in more detail, according to an embodiment of the invention employing an ECL-based clock.

Referring now to FIG. 5, this illustrates a second embodiment of the electromagnetic field generator of FIG. 3A in which the oscillator 30 is implemented in ECL. A complementary ECL clock 62 with built-in fast buffers (100 nano second rise/fall time, not shown) are connected through two DC -8 GHz broadband amplifiers 64,66 to a pair of loop antennas 68,69 which are again connected across respective termination loads 70,71. The broadband amplifiers 64,66 are used to add up to 10 dB of amplification to the outputs of the ECL clock 62.

In addition, the broadband amplifiers 64,66 are saturated at lower frequencies due to the high output level of the ECL clock 62. This helps to square the waveform so as to have a faster rise time, thus generating more harmonics at higher frequencies. Also shown is the regulated voltage supply consisting of a voltage regulator 61 which is connected to battery 60 and produces positive and negative regulated voltages $V_{cc}$ and $V_{EE}$. The ECL clock 62 runs off both these regulated voltages.

The advantages of the ECL clock based electromagnetic field generator are:
a) its emission levels are adequate for SE testing up to 10 GHz since faster clocks may be used;
b) the crystal is very stable;
c) as the battery dies, the emission levels die at once, as opposed to fading gradually.

A disadvantage of the ECL electromagnetic field generator is that it is relatively expensive due to the higher cost of ECL clocks.

The choice of which electromagnetic field generator to use depends on the frequency range of interest for SE testing. Available to the TTL electromagnetic field generator are 10 MHz to 110 MHz clocks. These frequencies work well for testing up to 2 GHz since many discrete harmonics exist for low frequency clocks, allowing for many test points over the frequency range. However, these harmonics die off rapidly and the TTL electromagnetic field generator is not very useful beyond 2 GHz. For the ECL electromagnetic field generator, two crystals are currently available: 155.52 MHz and 622.08 MHz. They both can produce useful harmonics up to 10 GHz. Due to the larger frequencies, however, there are fewer discrete test points for SE testing. The ECL electromagnetic field generator is ideal for testing new, higher-speed devices currently being developed by Northern Telecom Limited.

Figure 6:
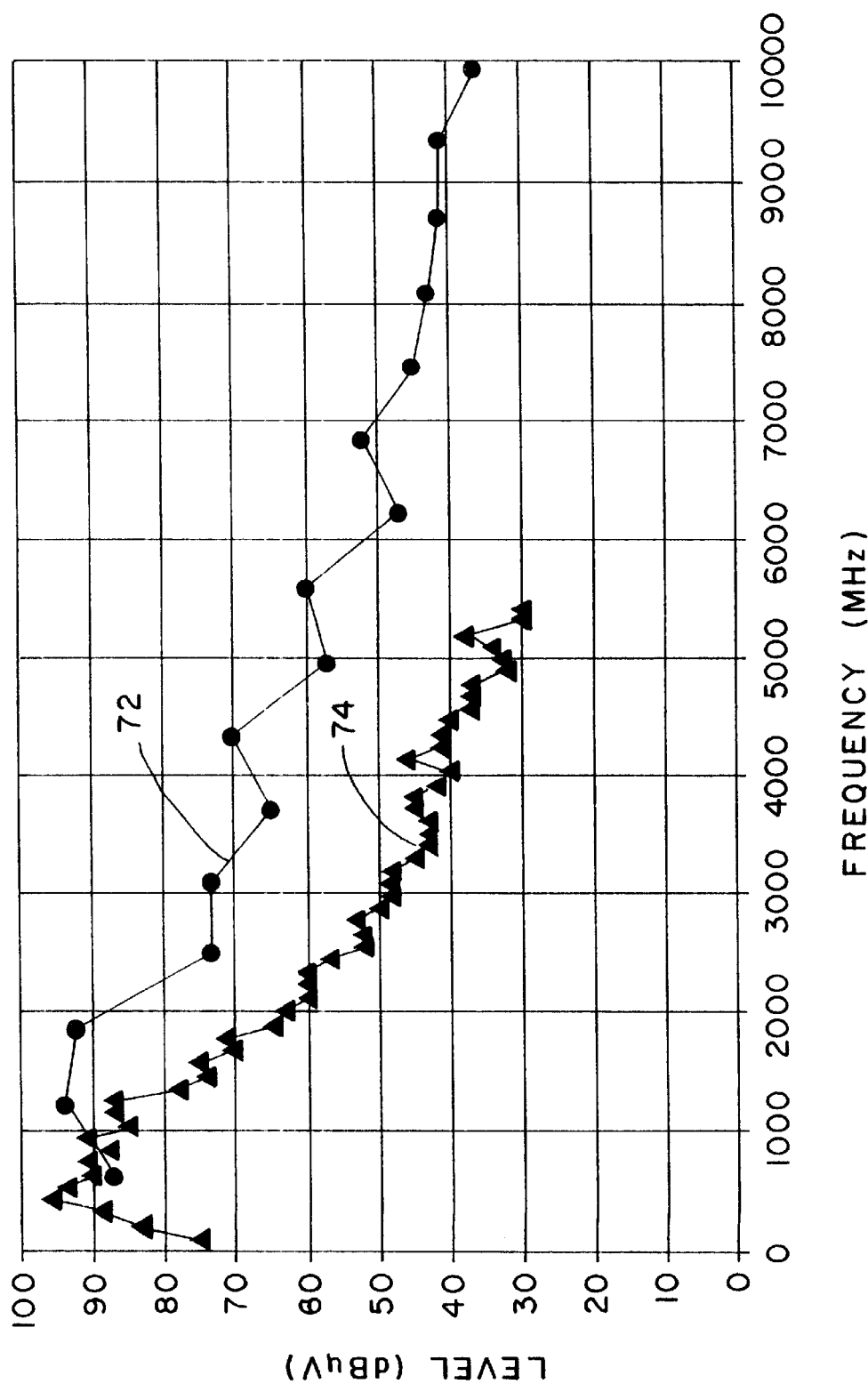
FIG. 6 is a plot of the harmonics produced by the electromagnetic field generators of FIGS. 4 and 5.

By way of example, in FIG. 6 the actual emissions from a 106.25 MHz TTL electromagnetic field generator and a 622.08 MHz ECL electromagnetic field generator are shown in plots 74,72 respectively. It can be clearly seen in FIG. 6 that the ECL source delivers more power at higher frequency but with less resolution. There are typically only 20 to 50 measurable harmonics in a trapezoidal waveform.

Both the TTL and ECL electromagnetic field generators last approximately 1 hour with a fresh 9 volt battery, however, this may vary due to differences from one battery to the next. The output voltage of the on-board regulators should be checked as often as possible and should read about 5 volts.

There are numerous factors which could influence how much SE is actually measured during testing. These include:
the measurement antenna's position (where it is pointed);
the distance between the shield/electromagnetic field generator and the measurement antenna;
the placement of the test setup within the anechoic chamber;
the height of the measurement antenna and the shield/electromagnetic field generator from the ground plane.

During use, the electromagnetic field generator 19 is placed inside the anechoic chamber 25 and turned on. An initial polarization for the measurement antenna is chosen, either horizontal or vertical.

In order to setup the spectrum analyzer 24, the frequency of the clock used in the electromagnetic field generator 19 must be known. The frequency listed on the clock itself is only a close estimate. The frequency should be measured to setup the instrumentation. This should be done after the clock has been running and is warmed up.

After the clock frequency is accurately determined, the spectrum analyzer 24 is used to make repetitive measurements at every harmonic of the source. To do this, the spectrum analyzer 24 centre frequency and the frequency step size are preferably set to the actual frequency of the clock. The span is set to a small value that permits the spectrum analyzer 24 to only see the clock harmonics. Too small a span value however may force any drift which may occur in the clock to cause the harmonics to move out of the screen. The resolution bandwidth and video bandwidth are set to small values to lower the spectrum analyzer 24 noise floor. The internal attenuation of the spectrum analyzer 24 should be set to 0 dB and the units to dB$\mu$V.

At each frequency, starting at the frequency of the clock, the peak search function on the spectrum analyzer 24 is used to measure the peak at each harmonic. This is done for each frequency until either the upper limit of the frequency range of interest is reached, or until the harmonics are within a certain limit of the noise floor of the spectrum analyzer 24 such as 6 dB, and cannot be measured.

The above described characterization procedure is preferably repeated for each antenna polarization and for a plurality of different electromagnetic field generator orientations, and for various rotational positions of the electromagnetic field generator 19. This is due to the fact that the electromagnetic field generator 19 is not an omnidirectional point source radiator and the harmonics measured will change with orientation. To obtain results for different rotational positions, the electromagnetic field generator 19 may be placed in a given orientation (vertical, horizontal, etc.) on a turntable which is rotated through 360 degrees for example. The maximum measurement over the rotation becomes the reading for that orientation. The maximum emission level or worst case of each harmonic for all of the orientations and polarizations measured is the final value which is used in the calculations for shielding effectiveness.

After the electromagnetic field generator 19 has been characterized in free space, the SE testing of the enclosure 10 is done. The electromagnetic field generator should be placed in the centre of the enclosure 10. One way to keep the electromagnetic field generator 19 centred is to strategically place non-conductive material in the shield. Rolled up paper placed around the electromagnetic field generator 19 works well in this regard.

Shielding effectiveness tests can be done on the entire enclosure or it may be isolated to certain openings or gaskets by copper taping all other openings. This aids in isolating problem areas on the enclosure.

The shielded electromagnetic field generator 10,19 is placed in the anechoic chamber 25 exactly where the free space electromagnetic field generator 19 was placed. The same procedures which were used to characterize the electromagnetic field generator 19 in free space are then performed. Readings obtained for the levels of the harmonics should be lower, reflecting the SE of the enclosure.

Figure 7:
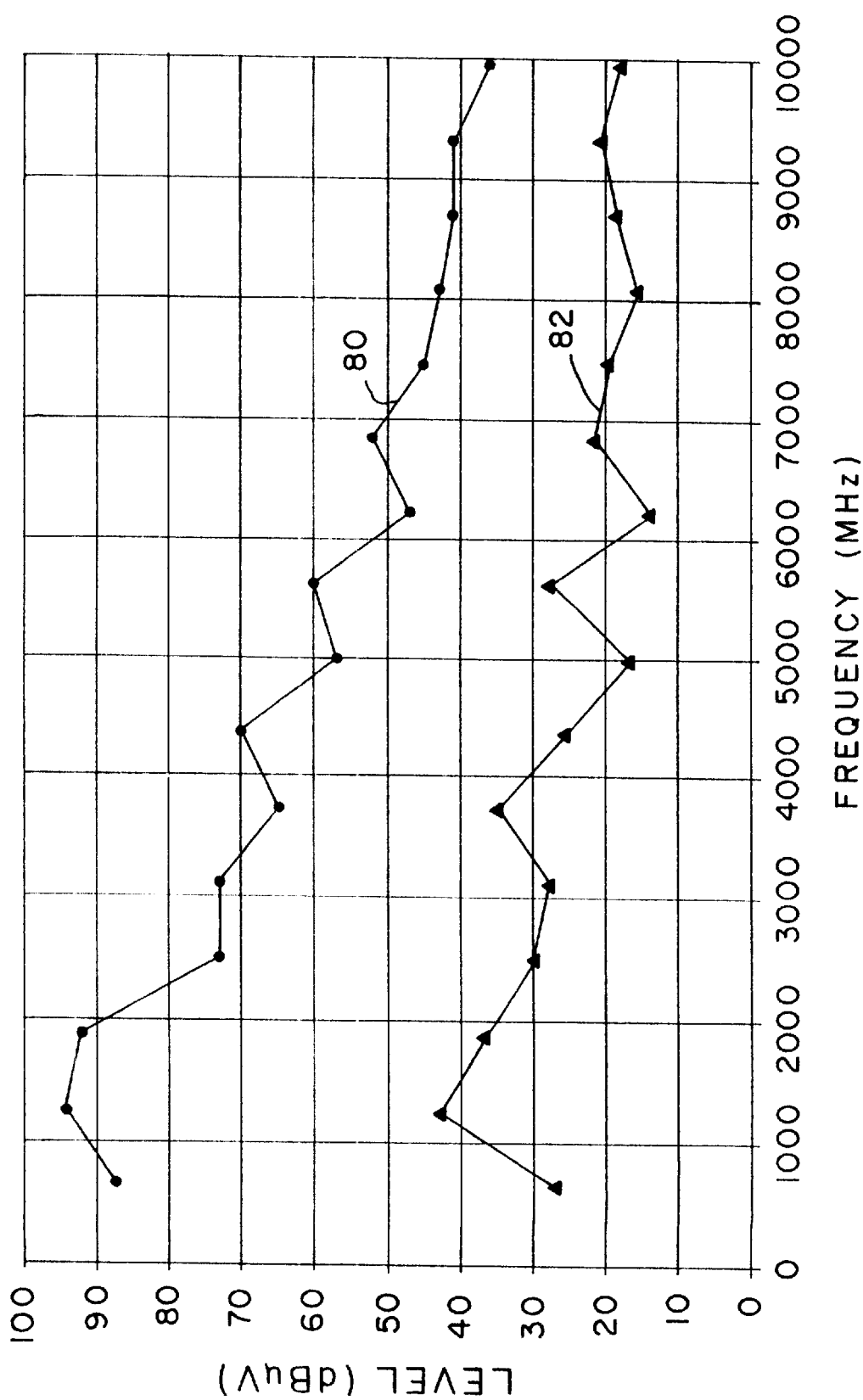
FIG. 7 is a plot of exemplary emissions spectra for a shielded electromagnetic field generator and for an unshielded electromagnetic field generator.
Figure 8:
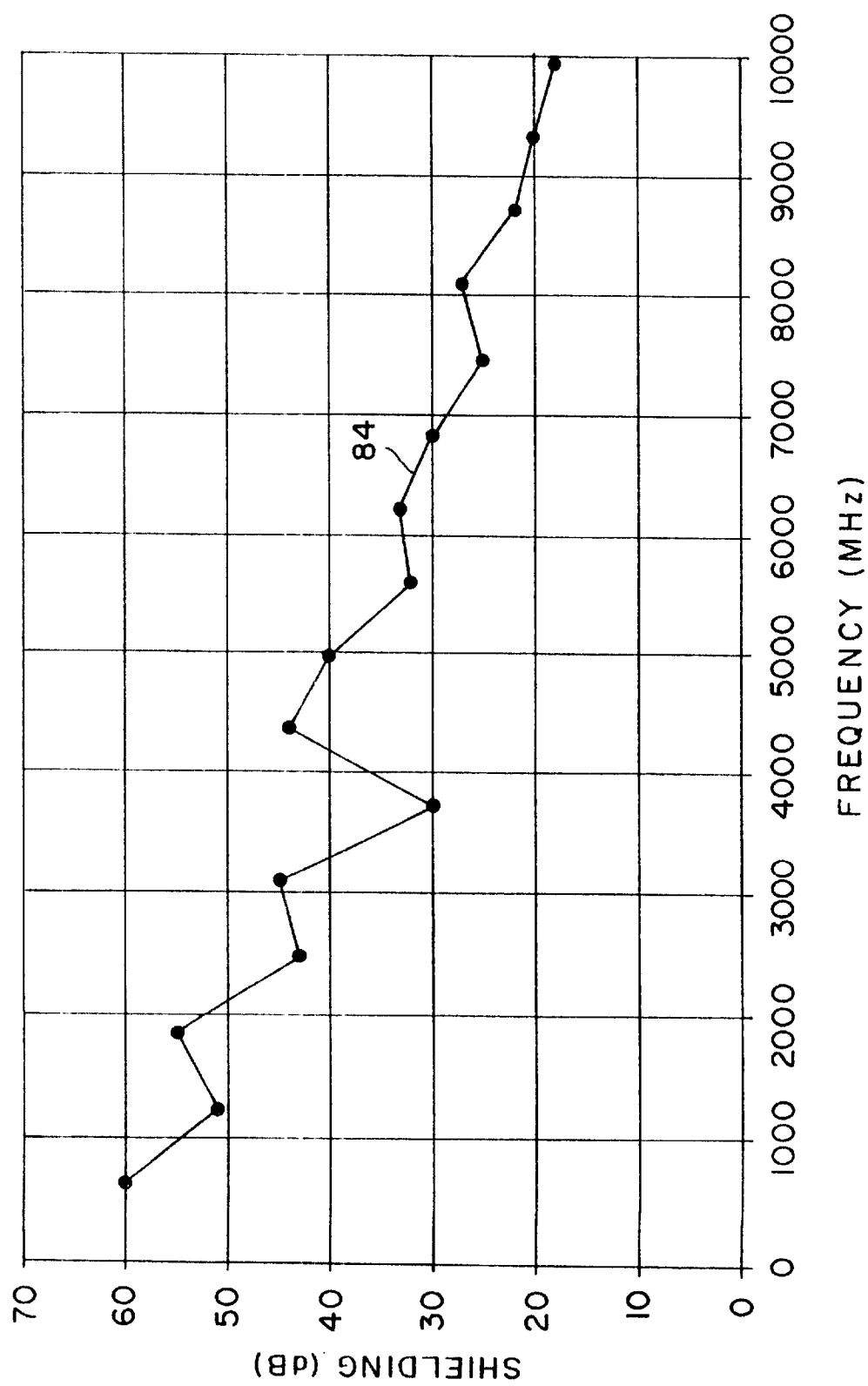
FIG. 8 is a plot of shielding effectiveness determined from the plot of FIG. 7.

Once all the data is collected, a graph such as shown in FIG. 7 may be produced. In FIG. 7, the top plot 80 is the maximum emission levels from the electromagnetic field generator 19 in free space, and the bottom plot 82 is the maximum emission levels from the electromagnetic field generator 19 within the enclosure 10. As stated previously, the shielding effectiveness of the enclosure 10 is the difference between the two plots, and this is shown as a plot 84 in FIG. 8.

Figure 9:
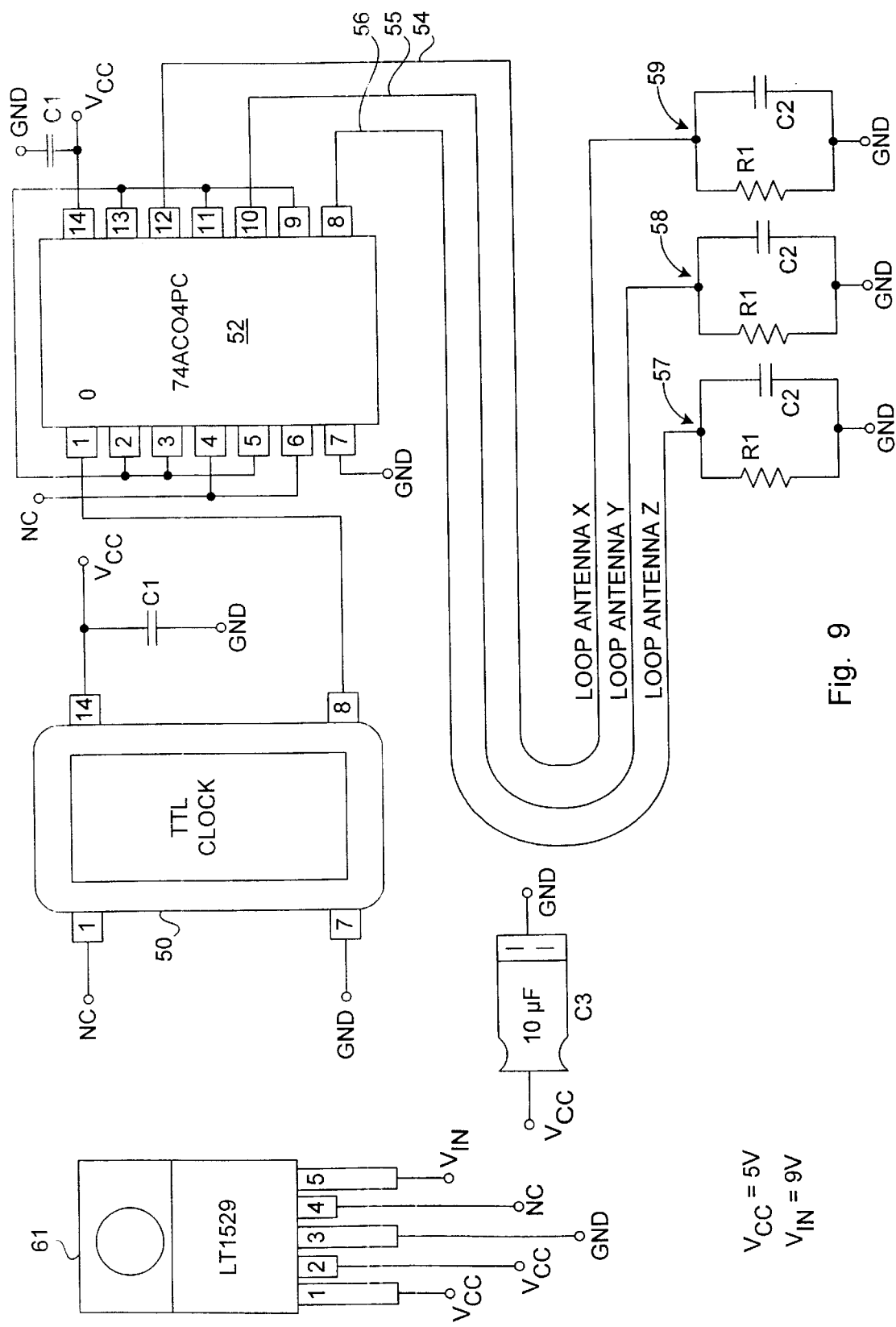
FIG. 9 is a detailed circuit diagram for the electromagnetic field generator of FIG. 4.

A schematic for a particular circuit implementation of the TTL clock based electromagnetic field generator of FIG. 4 is shown in FIG. 9 where like reference numerals have been used to identify like parts. In this example, the voltage regulator 61 is an LT1529 5V regulator, the buffer 52 is a 74AC04PC invertor, and the loads 57,58,59 are RC parallel circuits each consisting of a resistor R1 in parallel with a capacitor C2. A 9V battery (not shown) is used in this example. In a preferred implementation, R1 is a 4.3 kΩ resistor and C2 is a 10 pF capacitor. Preferably a decoupling capacitor C1 having a capacitance of 0.01 μF is used at the voltage source input to each of the TTL clock 50 and the buffer 52. Finally, preferably a 10 μF capacitor C3 is provided as a power supply decoupling capacitor.

Figure 10:
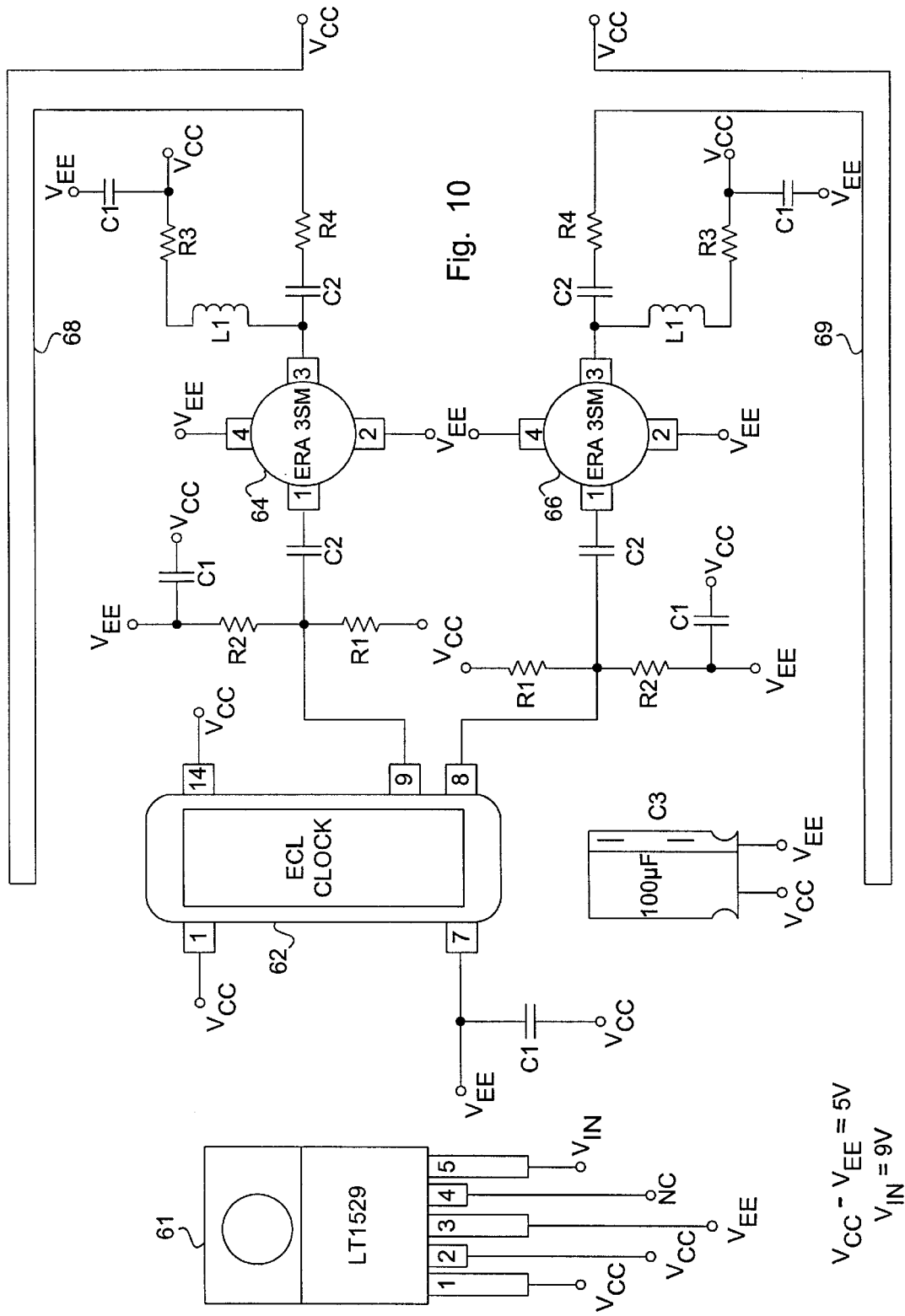
FIG. 10 is a detailed circuit diagram for the electromagnetic field generator of FIG. 5.

A schematic for a particular circuit implementation of the ECL clock based electromagnetic field generator of FIG. 5 is shown in FIG. 10 where like reference numerals have been used to identify like parts. In this example, the voltage regulator 61 is an LT 1529 5V regulator, and the amplifiers 64,66 are ERA 3SM DC-8 GHz amplifiers. Preferably, the DC-8 GHz amplifiers receive a clock signal and amplify it with over 10 dB of gain and with a maximum output of 12 dBm. Over the majority of the frequency band, compression occurs since the power of the input signal, plus the gain of the amplifier create a signal greater than the maximum output power of the amplifier. The output is thus distorted by "clipping", causing the signal to be more square with a faster edge rate. This creates greater harmonics at higher frequencies. In a preferred implementation, a resistor divider network consisting of resistors R1 and R2 is connected at the outputs of the ECL clock 62, where R1 and R2 are preferably 82Ω and 120Ω respectively. Preferably, DC biasing resistors R3=34Ω are provided and antenna impedance matching resistors R4=1Ω are provided. Decoupling capacitors C1=0.01 μF, C2=0.001 μF, and C3=100 μF are also preferably provided as is a 1 μH AC blocking inductor L1.

It is to be understood that while FIGS. 9 and 10 give very detailed preferred implementations of examples of electromagnetic field generators according to aspects of the inventions, these are preferred implementations only. Numerous modifications and variations of the present invention are possible in light of the above teachings. It is therefore to be understood that within the scope of the appended claims, the invention may be practised otherwise than as specifically described herein.

Preferably, PCB (printed circuit board) antennas are used for consistency and repeatability of tests.

In the example described with reference to FIGS. 2A and 2B, the measurement antenna 14 and the electromagnetic field generator/shielded electromagnetic field generator 19,10 were assumed to be located one meter above the ground plane, with the measurement antenna 14 located three meters from the electromagnetic field generator/shielded electromagnetic field generator 19,10. Preferably, for testing below 2 GHz the measurement antenna is three meters from the electromagnetic field generator, while for testing above 2 GHz the measurement antenna is preferably one meter from the electromagnetic field generator. Preferably, the measurement antenna 14 and the electromagnetic field generator 19 are located the same distance above the ground plane.

In the above described examples, ECL and TTL based oscillators have been used to produce trapezoidal clock signals which in turn produce a high number of harmonics.

All possible forms of logic may be used such as TTL, HCMOS, CMOS, ACMOS, ECL, PECL, GaAs, etc., for the clock, buffer, or amplifier. PCB antennae may be used for the TTL electromagnetic field generator, as with the ECL electromagnetic field generator. The amplifiers used do not necessarily need to have a specific frequency range or gains, so long as they work in the frequency range of interest of the shielding being tested. The buffers used do not necessarily need to be inverters, but may also be any other form of buffers which accept a clock and allow it to have a larger fanout. Buffers may be used on the ECL electromagnetic field generator, amplifiers may be used of the TTL electromagnetic field generator, and electromagnetic field generators can be made without either or with both amplifiers and buffers. If the clock has sufficient fanout and signal strength then it may not be necessary to include buffers or amplifiers. The electromagnetic field generator needs to be battery driven and therefore needs a voltage regulator. The choice of voltage regulator is irrelevant so long as it regulates to the proper voltage necessary for the logic being used. All possible permutations of buffers, amplifiers, clocks, voltage regulators, logic, antenna types, number of antennas, size, weight, or packaging may be used for electromagnetic field generators.

We claim:

1. A method of testing the effectiveness of electromagnetic shielding provided by an enclosure comprising:

with a self-contained source of electromagnetic radiation placed entirely within said enclosure, the source generating a signal having frequency content at a fundamental frequency and a plurality of harmonic frequencies, making a first series of measurements of radiation received from said source, one for each of the fundamental frequency and a finite number of the harmonic frequencies;

making a corresponding second series of measurements of radiation received from said source when the enclosure is removed, one for each of the fundamental frequency and said finite number of harmonic frequencies; and comparing the first series of measurements with the second series of measurements.

2. A method according to claim 1 wherein:

said step of making said first series of measurements comprises, for each particular measurement of said first series of measurements, the steps of:

a) making a respective first plurality of measurements for different polarizations of a measurement antenna;

b) determining the particular measurement to be the maximum of said first plurality of measurements; and said step of making said second series of measurements comprises, for each particular measurement of said second series of measurements, the steps of:

c) making a respective second plurality of measurements for different polarizations of the measurement antenna;

d) determining the particular measurement to be the maximum of said second plurality of measurements.

3. A method according to claim 1 wherein said step of comparing comprises the steps of:

determining the difference between each one of the first series of measurements and the corresponding one of the second series of measurements;

determining the difference and defining this to be the shielding effectiveness.

4. A method according to claim 1 wherein:

said step of making said first series of measurements comprises, for each particular measurement of said first series of measurements, the steps of:

a) making a respective first plurality of measurements for different orientations of the source antenna;

b) determining the particular measurement to be the maximum of said first plurality of measurements; and said step of making said second series of measurements comprises, for each particular measurement of said second series of measurements, the steps of:

c) making a respective second plurality of measurements for different orientations of the source antenna;

d) determining the particular measurement to be the maximum of said second plurality of measurements.

5. An apparatus for determining a shielding effectiveness provided by an enclosure comprising:

a self-contained battery powered source of electromagnetic radiation comprising a clock pulse generator, a source antenna and a battery;

a spectrum analyzer;

a measurement antenna connected to the spectrum analyzer;

wherein a first measurement is made of radiation received by the measurement antenna of radiation emanating from the source when located within the enclosure, a second measurement is made of radiation received by the measurement antenna of radiation emanating from the source when the enclosure is removed, and a comparison between the first and second measurements is made to determine the shielding effectiveness of the enclosure.

6. An apparatus according to claim 5 further comprising a low noise pre-amplifier connected between the measurement antenna and the spectrum analyzer.

7. An apparatus according to claim 5 further comprising an anechoic or semi-anechoic chamber, and wherein the self-contained battery powered source of electromagnetic radiation and the measurement antenna are both located within the chamber.

8. An apparatus according to claim 5 further comprising a turntable upon which is located the self-contained source of electromagnetic radiation.

\* \* \* \* \*